United States Patent [19]

Groehl

[11] Patent Number: 5,302,902
[45] Date of Patent: Apr. 12, 1994

[54] ABNORMAL BATTERY CELL VOLTAGE DETECTION CIRCUITRY

[75] Inventor: Lawrence R. Groehl, Eatontown, N.J.

[73] Assignee: The United States of America as represented by the Secretary of the Army, Washington, D.C.

[21] Appl. No.: 691,908

[22] Filed: Apr. 26, 1991

[51] Int. Cl.$^5$ .......................................... G01N 27/416
[52] U.S. Cl. ..................... 324/434; 320/48; 340/636; 324/426
[58] Field of Search ............... 324/433, 434, 426; 340/636; 320/48

[56]  References Cited

U.S. PATENT DOCUMENTS

| | | | |
|---|---|---|---|
| 3,846,773 | 11/1974 | Lintelmann et al. | 340/636 X |
| 4,316,185 | 2/1982 | Watrous et al. | 340/636 |
| 4,424,491 | 1/1984 | Bobbett et al. | 324/433 |
| 4,484,140 | 11/1984 | Dieu | 324/434 |
| 4,622,508 | 11/1986 | Matteau et al. | 320/48 X |
| 4,823,086 | 4/1989 | Whitmire et al. | 324/434 |
| 5,099,211 | 3/1992 | Nowak | 324/434 |
| 5,206,578 | 4/1993 | Nor | 320/48 X |

Primary Examiner—Kenneth A. Wieder
Assistant Examiner—Glenn W. Brown
Attorney, Agent, or Firm—Michael Zelenka; John M. O'Meara

[57]  ABSTRACT

Defective battery cells are detected by individually monitoring the voltage output therefrom, which characteristically becomes abnormal when the defective condition occurs. Each cell is independently referenced to a common ground by its voltage monitoring device which drives a level sensing comparator that generates a control signal when the output voltage from that cell becomes abnormal. This control signal drives at least one switch to indicate when the defective condition occurs.

2 Claims, 2 Drawing Sheets

ABNORMAL BATTERY CELL VOLTAGE DETECTION CIRCUITRY

GOVERNMENT INTEREST

The invention described herein may be manufactured, used, and licensed by or for the government for governmental purposes without payment to me of any royalties thereon.

BACKGROUND OF THE INVENTION

The present invention relates generally to the monitoring of defective conditions within batteries and more particularly, to the detection of such conditions from battery cell voltage output.

Apparatus for detecting most battery defects is well known. However, this apparatus usually monitors a parameter, such as abnormal voltage or current or power output relative to the overall battery, rather than to the individual cells thereof. For some types of defects, this overall battery approach is clearly inadequate. One such defect is found in a lithium type battery which often presents a dangerous pressure buildup therein when one or more of its cells has an abnormally low voltage output. The conventional approach for monitoring this defect is to mechanically sense the pressure within the overall battery and then appropriate corrective action is initiated at some critical pressure level. Because the operating tolerances of the mechanical pressure sensor are very wide, the critical pressure level of this approach must be significantly lower than desired to attain the required safety factor.

SUMMARY OF THE INVENTION

It is the general object of the present invention to monitor the voltage output from the individual cells of a battery with those cells referenced to a common ground.

It is a specific object of the present invention to accomplish the above-stated general object in a detector for indicating when pressure within at least one cell of a lithium type battery reaches a dangerous level.

These and other objects are accomplished in accordance with the present invention by referencing all of the battery cells to a common ground and generating a control signal when the voltage output from at least one of the cells is abnormal. The conductivity of at least one electrical path is changed in response to that signal when the invention is incorporated into a battery defect detector. In one embodiment, the signal is generated relative to each cell by a threshold detector when a differential amplifier senses that a predetermined voltage output has been reached for that cell. Operational amplifiers are individually arranged as the differential amplifier and the threshold detector for each cell in this embodiment. At least one electronic switch is utilized in the battery detector embodiment of the invention and responds to the control signal by changing its conductivity. Various arrangements of bipolar and/or field effect transistors can be utilized for such electronic switching. Capacitors may also be incorporated in such embodiments to attain switching stability.

The scope of the present invention is only limited by the appended claims for which support is predicated on the preferred embodiments hereinafter set forth in the following description and the attached drawings wherein like reference characters relate to like parts throughout the several figures.

DESCRIPTION OF THE PREFERRED EMBODIMENTS

Figure 1:
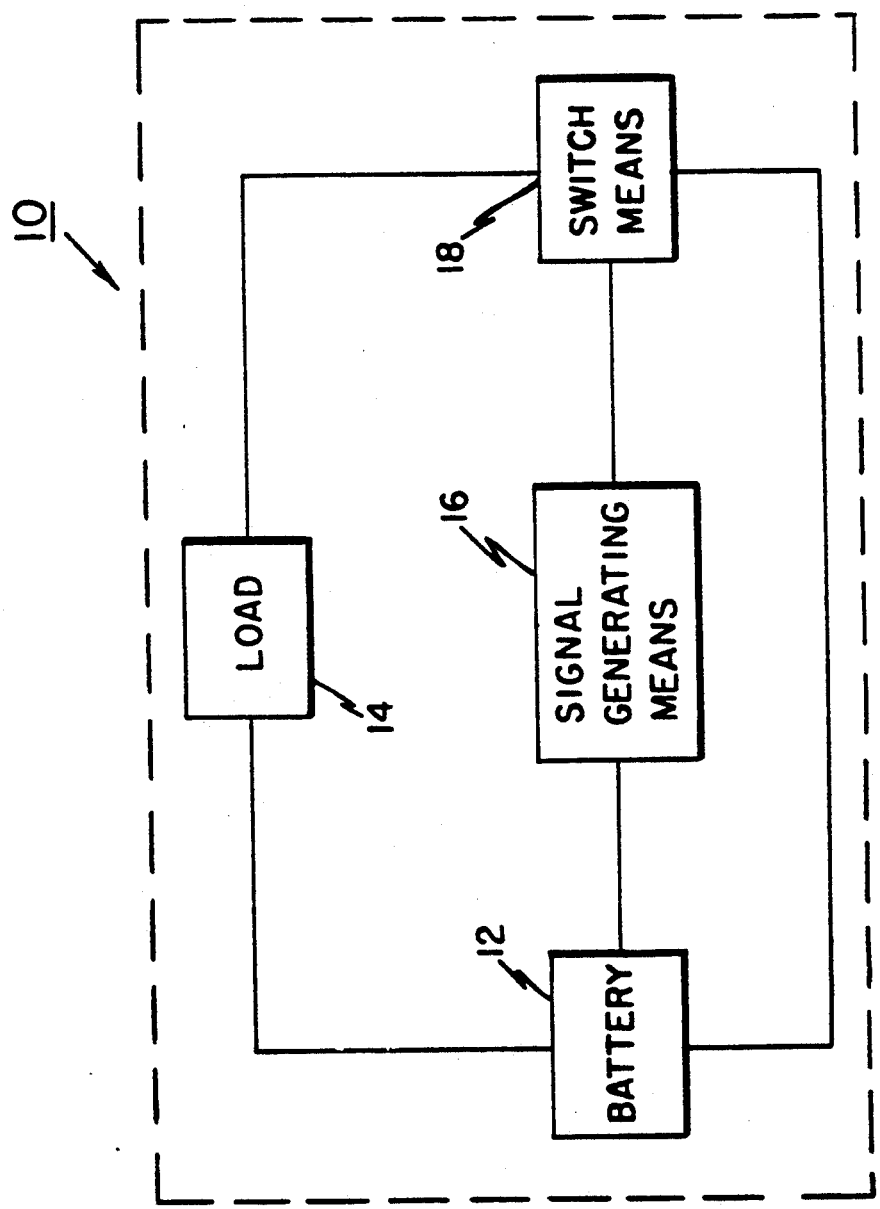
FIG. 1 is a block diagram of battery powered apparatus having the invention incorporated therein.

The invention described herein relates broadly to apparatus for monitoring a defective condition within a battery having a plurality of cells. As shown in FIG. 1, such apparatus can be implemented within any circuit 10 wherein a battery 12 is incorporated to supply current to a load 14. By way of the invention, a means 16 is incorporated for referencing the cells of the battery 12 to a common ground while generating a control signal when the voltage output from at least one battery cell becomes abnormal to indicate the defective condition. Of course, the control signal may be generated either for abnormally high voltage output or for abnormally low voltage output within the broad scope of the invention. Also, a switch means 18 for responding to the control signal by changing the conductive state of at least one electrical path through which current flows from the battery 12, may be utilized for indicating when a defective condition occurs and/or for remedying a danger presented by that condition.

Figure 2:
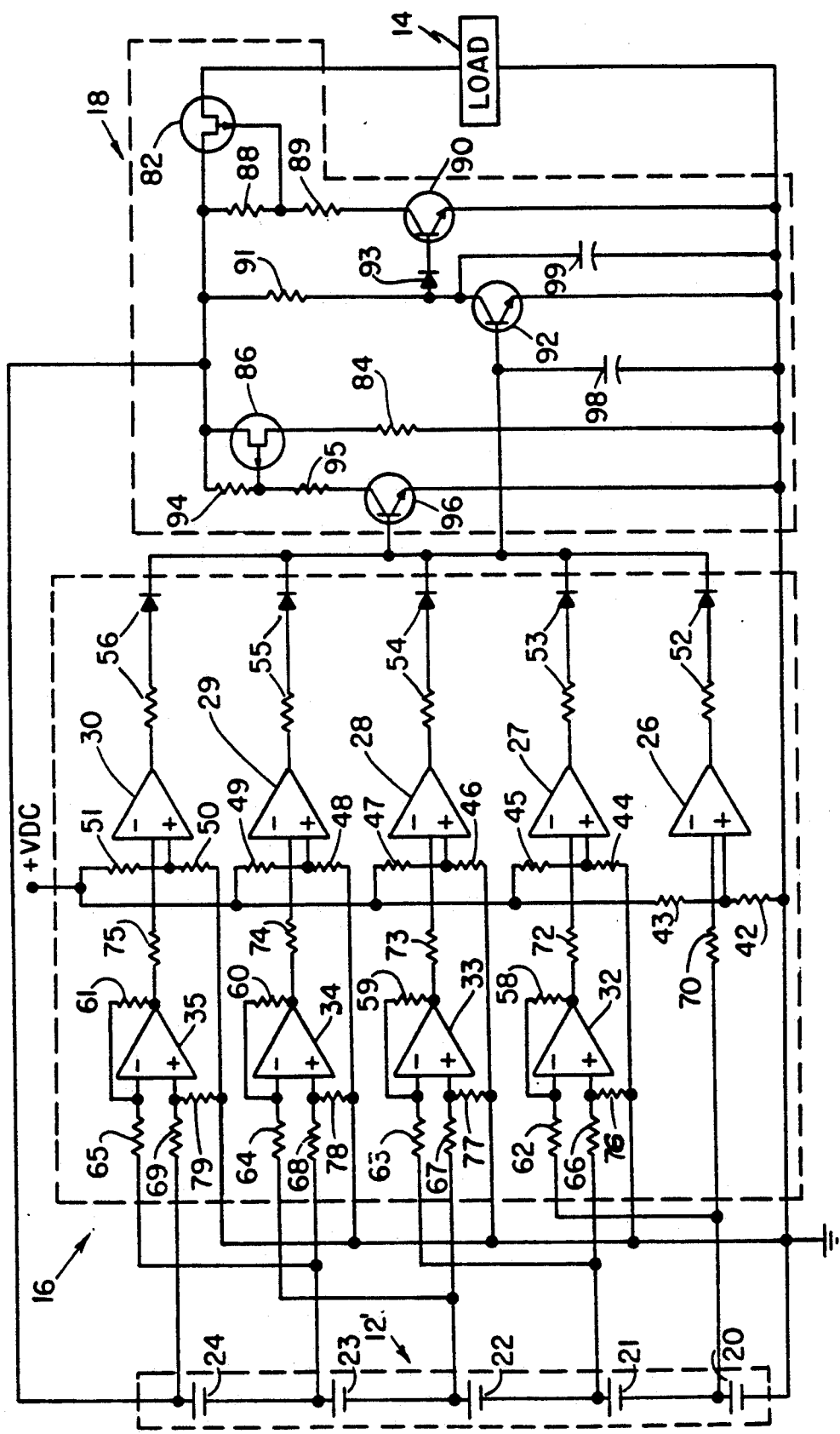
FIG. 2 is a schematic/block diagram of the invention incorporated in apparatus which remedies the danger presented when a pressure buildup occurs within at least one cell of a lithium type battery.

Although the invention has many applications in which different embodiments thereof would be utilized, FIG. 2 relates to a particular application thereof for which dangerous pressure buildups within a lithium type battery 12' having a plurality of cells 20, 21, 22, 23, 24 must be detected and remedied. As is well known in the electrochemical arts, lithium type batteries characteristically develop large quantities of gas when the voltage output from one or more of their cells is abnormally low. Of course, this gas accumulates internally within such batteries and causes a pressure buildup which presents a dangerous situation due to the possibility of explosion. One approach for remedying this dangerous situation is to disconnect the load 14 from the battery 12' as quickly as possible, and dissipate the charge in the battery 12' at a safe rate.

In the FIG. 2 embodiment, the signal generating means 16 includes threshold detectors 26, 27, 28, 29 and 30 which individually derive the control signal when the voltage output from one of the cells 20-24 respectively, reaches a predetermined reference level and differential amplifiers 32, 33, 34 and 35 which individually detect the voltage output from one of the cells 21-24 respectively, that have no direct connection to ground. Each of the threshold detectors 27-30 functions in cooperation with one of the individual differential amplifiers 32-35 respectively, and except for the added cost and power consumption thereof, a differential amplifier (not shown) could be including for threshold detector 26 within the scope of this invention. Because the battery must be both disconnected and discharged to accomplish the above mentioned approach for remedying the dangerous battery situation, the switch means 18 in the FIG. 2 embodiment must control the conductivity through at least two electrical paths. However, only the conductivity through one electrical path need be controlled in other applications for which the invention could be utilized.

Conventionally arranged operational amplifiers serve as both the threshold detectors 26–30 and the differential amplifiers 32–35 in the signal generating means 16 of FIG. 2. As is well known to those skilled in the electronic arts, each operational amplifier includes an output connection, along with inverting and non-inverting signal input connections. Also each operational amplifier is energized with a DC bias voltage applied across positive and negative power input connections (not shown). Each threshold detector 26–30 includes an input terminal at the inverting input connection of its operational amplifier, a threshold set terminal at the non-inverting input connection of its operational amplifier, and an output terminal at the output connection of its operational amplifier. Functionally, each threshold detector 26–30 produces a low level signal at its output terminal when the voltage level at its input terminal exceeds the voltage level at its threshold set terminal and otherwise, a high level signal is produced thereat. A predetermined voltage level relative to ground is applied to the threshold set terminal of each threshold detector 26–30 in accordance with the battery cell voltage output at which that threshold detector is to output the control signal. Each predetermined voltage level may be derived in any conventional way, such as with a voltage divider through which a bias voltage (+VDC) is connected to ground. Pairs of resistors 42–43, 44–45, 46–47, 48–49 and 50–51 are included in the voltage dividers, each of which relate to one of the threshold detectors 26–30 respectively. The nodes between the resistors in each voltage divider are separately connected in sequence to the threshold set terminals of the individual threshold detectors 26–30 respectively, from the output terminals of which the control signal is directed through resistor-diode series combinations 52, 53, 54, 55, 56 respectively. In each differential amplifier 32–35, a feedback resistor 58, 59, 60, 61 respectively, is conventionally connected between the output and the inverting input of its operational amplifier. The voltage output from each battery cell 21–24 is individually applied to one of the differential amplifiers 32–35 respectively, with the low side thereof being connected to the inverting input of its operational amplifier through a resistor 62, 63, 64, 65 respectively, and the high side thereof connected to the non-inverting input of its operational amplifier through a resistor 66, 67, 68, 69 respectively. For this particular embodiment of the invention, the high side of the voltage output from battery cell 20 is applied directly to the input terminal of threshold detector 26 through a resistor 70 while the low side thereof is grounded. Each differential amplifier 32–35 applies its output to the input terminal of one threshold detector 27–30 respectively, through individual resistors 72, 73, 74, 75 respectively, and has the non-inverting input of its operational amplifier grounded through individual resistors 76, 77, 78, 79 respectively.

The switch means 18 of FIG. 2 connects the load 14 across the battery 12' through a field effect transistor (hereinafter FET) 82 and a charge dissipating resistor 84 is connected across the battery 12' through a FET 86. Resistors 88, 89 are series connected from the positive side of the battery 12' through a bipolar junction transistor (hereinafter BJT) 90 to the negative side of the battery 12' or ground, and the gate of FET 82 is connected to the node between resistors 88 and 89. A resistor 91 is connected from the positive side of the battery 12' through a BJT 92 to ground, while the base of BJT 90 connects to the node between resistor 91 and BJT 92 through a diode 93. Resistors 94, 95 are series connected from the positive side of the battery 12' through a BJT 96 to ground and the gate of FET 86 connects to the node between resistors 94, 95. The control signal from the output of the signal generating means 16 is applied to the bases of both BJT's 92, 96. Capacitors such as 98, 99 may be individually connected from ground to the base and collector respectively, of the BJT's such as 92.

Each differential amplifier 32–35 functions to output a voltage proportional to the difference between the voltage applied at the non-inverting input of its operational amplifier from the positive side of one cell 21–24 and the voltage applied to the inverting input of that operational amplifier from the negative side of that cell. The proportionality factor for each differential amplifier 32–35 is determined by the size of its feedback resistor 58–61 respectively, divided by the size of its inverting input resistor 62–65 respectively. Within the battery 12', cells 20–24 are consecutively connected in series with only the negative side of cell 20 grounded and consequently the positive side of each cell 21–24 is only referenced to ground through the other cells which are active elements in the FIG. 2 embodiment. Therefore, to derive an independent reference to ground for each positive side connection of the cells 21–24 to the non-inverting inputs of the differential amplifiers 32–35 respectively, each such connection is grounded through one of the resistors 76–79. Although the DC bias voltage applied across the positive and negative power input connections of the operational amplifier in each differential amplifier 32–35 may be derived from the battery 12', it should also be independently referenced to ground so that output drift from the differential amplifiers 32–35 is precluded. Of course, the magnitude of this DC bias voltage limits the linear range of the output from each differential amplifier 32–35 and situations can arise where the voltage at the nodes between the cells 20–24 exceeds that magnitude to result in operational amplifier saturation. When such situations arise, saturation of the operational amplifiers can be avoided by selecting the inverting input resistor 62–65 and feedback resistor 58–61 of each differential amplifier 32–35 respectively, as well as the non-inverting input resistors 66–69 and ground reference resistors 76–79, to appropriately scale the input voltages to each differential amplifier 32–35 so that the output voltage derived therefrom is within the linear range of its operational amplifier.

Each resistor 72–75 respectively, serves to limit the current passing from the output of the individual differential amplifiers 32–35 respectively, to the input terminal of the individual threshold detectors 27–30 respectively. Because the negative side of cell 20 connects directly to ground, no independent reference to ground is necessary for the positive side thereof, from which current passing to the input terminal of threshold detector 26 is limited by the resistor 70. The node between each pair of resistors 42–43 and 50–51 respectively in the individual voltage dividers, applies a voltage at the threshold set terminal of the individual threshold detectors 26–30 respectively, that determines when the control signal passes from the output terminal thereof. The control signal is generated in the FIG. 2 embodiment when the voltage output from at least one of the cells 20-24 decreases to an abnormally low magnitude, which reduces the voltage on the input terminal of at least one threshold detector 26-30 to or below the voltage applied at the threshold set terminal thereof. Those skilled in the art of circuitry will realize without any further explanation, that the magnitude at which the cell output voltage becomes abnormal is determined by the particular battery defect to be detected and that the signal generating means 16 can be arranged to produce the control signal for any such magnitude. It will also be realized, that detection of an abnormally high magnitude of voltage output from at least one of the cells 20-24 is made possible by merely changing each threshold detector 26-30 to have the input terminal at the non-inverting connection of its operational amplifier and the threshold set terminal at the inverting connection thereof. Furthermore, the resistors in each voltage divider pair 42-43 and 50-51 may be sized to provide a different abnormal magnitude for each of the cells 20-24. Of course, the number of cells 20-24 in the battery 12' does not limit the scope of the invention, which also extends to the cells 20-24 being arranged in parallel when an abnormal voltage thereacross will detect a particular defect for the total arrangement.

When the control signal is applied to the switch means 18 from the signal generating means 16, current passing to the load 14 from the battery 12' is interrupted, while the passage of current therefrom to the charge dissipating resistor 84 is initiated. Although solenoid activated relays could be utilized in the switch means 18 to direct current, FET's 82 and 86 function in the FIG. 2 embodiment to direct current from the battery 12'. BJT's 90, 92 and 96 of the NPN type are arranged with FET's 82 and 86 which are of the N channel type. More specifically, BJT 90 and BJT 92 function with FET 82 in a cooperating group of three transistors, while BJT 96 functions with FET 86 in a cooperating transistor pair. However, those skilled in the art will certainly realize without further explanation that many other transistor arrangements are possible for the switch means 18 within the scope of this invention. In response to the control signal, the cooperating group of three transistors interrupts current flow between the battery 12' and the load 14, while the cooperating transistor pair provides for current flow between the battery 12' and resistor 84. Application of the control signal to the switch means 18 renders the BJT's 92 and 96 conductive to drop the voltage on the gate of FET 86 and the anode of diode 93, with the result being that FET 82 becomes non-conductive while FET 86 becomes conductive in substantially simultaneous fashion. BJT 90 contributes to this result by becoming non-conductive to raise the voltage on the gate of FET 82. Capacitors 98 and 99 render the control signal noise free relative to BJT 92 and thereby stabilize the switching action thereof.

Those skilled in the art will appreciate without any further explanation that many modifications and variations are possible to the above disclosed embodiments of the battery defect detector, within the concept of this invention. Consequently, it is understood that all such modifications and variations fall within the scope of the following claims.

What I claim is:

1. An apparatus for monitoring a defective condition of a battery having a plurality of cells, the improvement comprising:
    means for referencing each battery cell to a common ground while generating a control signal when the voltage output from at least one battery cell becomes abnormal due to the defective condition; and
    transistor arranged in cooperating groups of three with each said group including a pair of bipolar junction transistors and a field effect transistor, each said bipolar junction transistor being controlled at a gate terminal;
    each said cooperating group of three transistors having said field effect transistor connected therein to pass current from the battery and having said control signal applied therein to the base terminal of one transistor in said bipolar junction transistor pair, while the gate terminal of said field effect transistor therein is driven by the other transistor in said bipolar junction transistor pair to control the current passing through said field effect transistor.

2. A detector for indicating when the pressure within at least one cell of a lithium type battery reaches a dangerous level, comprising:
    means for referencing each cell to a common ground while generating a control signal when the voltage output from at least one cell becomes abnormally low; and
    transistors arranged in cooperating groups of three with each said group including a pair of bipolar junction transistors and a field effect transistor, each said bipolar junction transistor being controlled at a base terminal and each said field effect transistor being controlled at a gate terminal;
    each said cooperating group of three transistors having said field effect transistor therein connected to pass current from the battery and having said control signal applied therein to the base terminal of one transistor in said bipolar junction transistor pair, while the gate terminal of said field effect transistor therein is driven by the other transistor in said bipolar junction transistor pair to control the current passing through said field effect transistor.

* * * * *